United States Patent
Dono et al.

(10) Patent No.: US 7,215,589 B2
(45) Date of Patent: May 8, 2007

(54) SEMICONDUCTOR MEMORY DEVICE THAT REQUIRES REFRESH OPERATIONS

(75) Inventors: Chiaki Dono, Tokyo (JP); Yasuji Koshikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/347,293

(22) Filed: Feb. 6, 2006

(65) Prior Publication Data

US 2006/0176749 A1 Aug. 10, 2006

(30) Foreign Application Priority Data

Feb. 9, 2005 (JP) ............................. 2005-032618

(51) Int. Cl.
G11C 7/00 (2006.01)
G11C 8/00 (2006.01)

(52) U.S. Cl. ....................... 365/222; 365/195; 365/236

(58) Field of Classification Search ................ 365/222, 365/195, 236
See application file for complete search history.

(56) References Cited

U.S. PATENT DOCUMENTS 5,559,748 A * 9/1996 Numata et al. ............. 365/222
6,141,288 A * 10/2000 Numata et al. ......... 365/230.03
6,487,135 B2 * 11/2002 Watanabe et al. ........... 365/222

FOREIGN PATENT DOCUMENTS

JP 2000-132963 5/2000

* cited by examiner

*Primary Examiner*—Son Dinh
(74) *Attorney, Agent, or Firm*—McDermott Will & Emery LLP

(57) ABSTRACT

A semiconductor memory device includes a refresh counter that outputs an address of a word line to be refreshed, a ROM circuit that stores a relevant address related to a refresh defective address, and a multiple refresh control circuit that simultaneously or continuously activates the refresh defective address and the relevant address within one refresh cycle in response to a fact that the ROM circuit detects the relevant address. The multiple refresh control circuit excludes a pattern having a risk that a power supply potential or a ground potential varies greatly such as a pattern that the multiple refresh occurs continuously. With this arrangement, a refresh defective cell can be saved while restricting the variation in the power supply potential or the ground potential.

17 Claims, 13 Drawing Sheets

SEMICONDUCTOR MEMORY DEVICE THAT REQUIRES REFRESH OPERATIONS

TECHNICAL FIELD

The present invention relates to a semiconductor memory device. Particularly, the present invention relates to a semiconductor memory device that requires refresh operations such as a DRAM (Dynamic Random Access Memory).

BACKGROUND OF THE INVENTION

The density of a DRAM can be most suitably increased among various kinds of semiconductor memory devices, and the DRAM is widely used for a main memory of a computer and the like. The prime reason that the density of the DRAM can be most suitably increased is that the structure of the memory cell of the DRAM is remarkably simple as compared with that of other semiconductor memory devices. In other words, the memory cell of the DRAM consists of one capacitor and one MOS transistor, and stores information based on a charge stored in the capacitor. Charging to and discharging from the capacitor is controlled by a MOS transistor whose gate electrode is connected to a word line. When the MOS transistor is turned on, a storage electrode of the capacitor is connected to a bit line, thereby reading or writing information.

Because the memory cell of the DRAM stores information based on the charge stored in the capacitor, the stored information disappears due to a leaked current, when refresh operation is not carried out periodically. Therefore, before the information disappears due to the leakage current, all memory cells need to be refreshed. A cycle of refreshing all memory cells (=tREF) is determined as 64 msec, for example, based on a specification.

This means that time equal to or more than tREF is required as the time for holding information of each memory cell. Therefore, a memory cell of which information-holding time is less than tREF is a "refresh defective cell". An address corresponding to the refresh defective cell is handled as a "refresh defective address". Usually, a refresh defective address is relieved by replacing the refresh defective cell with a redundant memory cell, and chips including these redundant memory cells are shipped as normal chips.

However, as miniaturization and density increase continue, the number of refresh defective cells included in one chip increases greatly. Consequently, in recent years, the number of redundant memory cells to be prepared for one chip and the number of fuse elements (ROMs) for storing a defective address increase remarkably. These increases in the number of memory cells and fuse elements prevent the increase in the density of the DRAM.

In order to solve the above problem, the refresh defective cell of which information holding time is slightly short of tREF can be saved by increasing the frequency of executing the refresh operation, instead of replacing the refresh defective cell with the redundant memory cell. For example, when the refresh defective cell has the information holding time which is short of tREF (=64 msec, for example) and is equal to or above tREF/2 (=32 msec, for example), the information can be saved by doubling the frequency of executing the refresh operation, instead of replacing the refresh defective cell with a redundant memory cell.

A technique of saving the refresh defective cell by increasing the refresh frequency of only a specific memory cell is described in Japanese Patent Application Laid-open No. 2000-132963. According to this prior art, when an address of which only a part of bits is different from the refresh defective address is given from the refresh counter, not only a word line corresponding to the address shown by a refresh counter but also a word line corresponding to the refresh defective cell are simultaneously activated. This technique is known as a multiple refresh technique.

However, when the word line corresponding to the address shown by the refresh counter and the word line corresponding to the refresh defective cell are activated simultaneously, approximately two times of the current that flows in the normal refresh operation flows. This large current can be momentarily secured when the normal power supply circuit is used. However, when conditions that require a large current appear continuously, the power supply potential and the ground potential vary greatly, resulting in the occurrence of an erroneous operation.

In order to prevent a voltage variation due to a large current, the power supply circuit needs to be increased. In this case, the area occupied by the power supply circuit increases, and this interrupts the increasing of the density.

SUMMARY OF THE INVENTION

It is an object of the present invention to provide a semiconductor memory device that can save a refresh defective cell while effectively restricting variation in the power supply potential and the ground potential.

The above and other objects of the present invention can be accomplished by a semiconductor memory device, comprising: a plurality of word lines including a first word line and a second word line; a plurality of memory cells connected to the word lines; a first unit that outputs an address of a word line to be activated; a second unit that carries out multiple refresh of simultaneously or continuously activating the first word line corresponding to the defective memory cell and the second word line related to the first word line, within one refresh cycle, in response to a fact that at least the first unit outputs an address of the second word line; and a third unit that limits an appearance pattern of the multiple refresh.

Preferably, the second unit includes a ROM circuit that stores at least a part of bits of the address of the word line corresponding to a defective memory cell. Preferably, this ROM circuit does not include a degenerate bit, like a ROM circuit that stores other defects. However, when the actual product design is considered, in some cases, a degenerate bit is provided in the ROM circuit due to a constraint of trade off between the mounting area of the ROM circuit and productivity.

When a degenerate bit is provided in the ROM circuit, it is more preferable to set the degenerate bit in the bit other than the lowest bit of the address output by the first unit. This is because when the degenerate bit is set in the bit other than the lowest bit, the occurrence of a multiple refresh that increases due to the provision of the degenerate bit can be dispersed. In this case, it is most preferable to set the degenerate bit in the highest bit of the address output by the first unit.

According to the present invention, because the appearance pattern of the multiple refresh is limited, a pattern having a risk of a large variation in the power supply potential or the ground potential such as a pattern of continuous occurrence of the multiple refresh can be excluded.

Accordingly, the refresh defective cell can be relieved while restricting a variation in the power supply potential or the ground potential.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
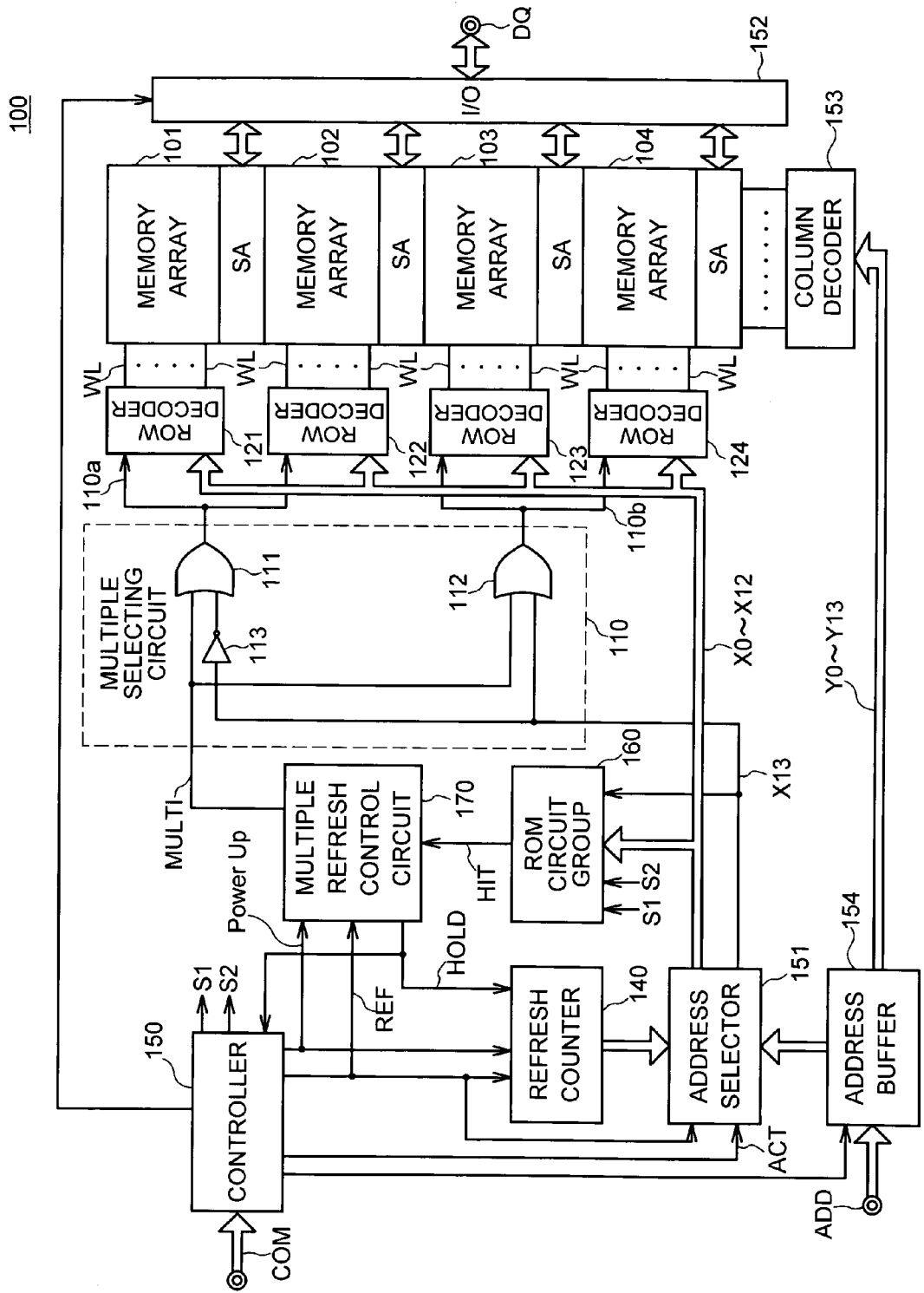
FIG. 1 is a block diagram showing a configuration of a semiconductor memory device according to a preferred embodiment of the present invention.

FIG. 1 is a block diagram showing a configuration of a semiconductor memory device 100 according to a preferred embodiment of the present invention.

As shown in FIG. 1, the semiconductor memory device 100 according to the present embodiment includes memory arrays 101 to 104. The semiconductor memory device 100 has a read function of reading data stored in an address supplied via an address pin ADD, and outputting the stored data via a data pin DQ. The semiconductor memory device 100 also has a write function of writing the data supplied via the data pin DQ into the address supplied via the address pin ADD. While the four memory arrays are provided in this embodiment as an example, the number of memory arrays is not particularly limited in the present invention, and one memory array can be divided into plural sub-arrays.

Figure 2:
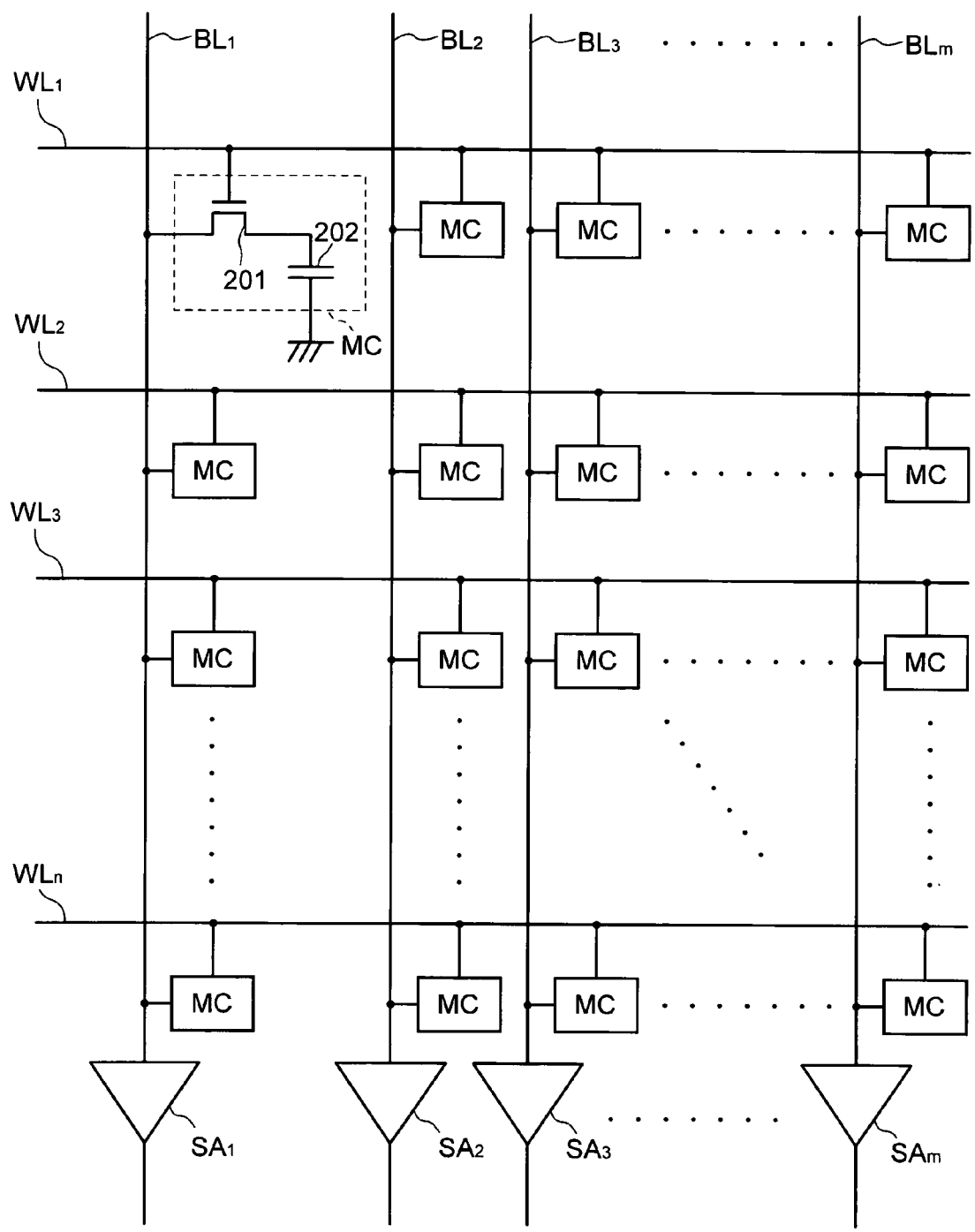
FIG. 2 is a circuit diagram showing a schematic configuration of the memory arrays shown in FIG. 1.

FIG. 2 is a circuit diagram showing a schematic configuration of the memory arrays 101 to 104.

As shown in FIG. 2, the memory arrays 101 to 104 have a matrix structure having plural word lines WL1 to WLn and plural bit lines BL1 to BLm crossed each other. A memory cell MC is disposed at intersections of word lines and bit lines. Each memory cell MC includes a series circuit of a MOS transistor 201 and a capacitor 202. A drain of the MOS transistor 201 is connected to corresponding bit lines BL1 to BLm, and a gate electrode of the MOS transistor 201 is connected to corresponding word lines WL1 to WLn. Based on this arrangement, when a certain word line WL1 changes to a high level, the capacitors 202 of all the memory cells MCs connected to the word line WL1 are connected to the corresponding bit lines BL1 to BLm.

A multiple selecting circuit 110 and row decoders 121 to 124 shown in FIG. 1 control the word lines WL1 to WLn. The multiple selecting circuit 110 receives a highest bit (X13 in this embodiment) of a row address (having 14 bits from X13 to X0 in this embodiment) supplied from an address selector 151, and a multiple refresh signal MULTI described later, and activates any one of or both predecode signals 110a and 110b based on these receptions.

More specifically, the multiple selecting circuit 110 includes an OR circuit 111 that generates the predecode signal 110a, an OR circuit 112 that generates the predecode signal 110b, and an inverter 113. When the multiple refresh signal MULTI is at a low level, the multiple selecting circuit 110 activates any one of the predecode signals 110a and 110b based on a logical value of the highest bit X13 of the row address. When the multiple refresh signal MULTI is at a high level, the multiple selecting circuit 110 activates both the predecode signals 110a and 110b regardless of a logical value of the highest bit X13 of the row address.

The predecode signal 110a is used to activate the row decoders 121 and 122, and predecode signal 110b is used to activate the row decoders 123 and 124. The row decoders 121 to 124 receive lower bits (lower 13 bits from X12 to X0 in this embodiment) of the row address supplied from the address selector 151, and activates any one of the corresponding word lines WL1 to WLn based on these receptions. The row decoders 121 to 124 can have a configuration divided into a precoder and a main decoder.

On the other hand, as shown in FIG. 2, the bit lines BL1 to BLm are connected to corresponding sense amplifiers SA1 to SAm. With this arrangement, these sense amplifiers amplify a signal read from the memory cell MC, during the reading operation, and amplify a signal to be written into the memory cell MC, during the writing operation. A column decoder 153 shown in FIG. 1 decides and controls which one of the sense amplifiers SA1 to SAm is to be connected to an I/O circuit 152. The column decoder 153 receives a column address (having 14 bits from Y13 to Y0 in this embodiment) supplied from an address buffer 154, and connects one or more of the sense amplifier SA1 to SAm selected based on the received address, to the I/O circuit 152.

The address buffer 154 is a circuit that temporarily holds an external address supplied via the address pin ADD. The held address is supplied to the address selector 151 or the column decoder 153. Specifically, when the external address is a row address, this external address is supplied to the address selector 151. When the external address is a column address, this external address is supplied to the column decoder 153. A controller 150 controls the supply of these external addresses, based on a "command" including a combination of external control signals RAS, CAS, CS, WE, etc. that are supplied via a control signal pin COM.

The address selector 151 selects one of the row address supplied from the address buffer 154 and the row address supplied from a refresh counter 140, supplies the highest bit (X13) of the selected address to the multiple selecting circuit 110, and supplies the lower bits (the lower 13 bits from X12 to X0) in common to the row decoders 121 to 124.

The controller 150 also controls these supplies, based on the command supplied via the control signal pin COM. Specifically, when the command supplied via the control signal pin COM shows a read operation or a write operation, an activation signal ACT signal supplied from the controller 150 is activated. Based on this, the address selector 151 selects a row address from the address buffer 154. On the other hand, when the command supplied via the control signal pin COM shows a refresh operation, a refresh signal REF supplied from the controller 150 is activated. Based on this, the address selector 151 selects a row address from the refresh counter 140.

The content of the refresh counter 140 is incremented (or decremented) each time when a refresh command is supplied via the control signal pin COM.

Figure 3:
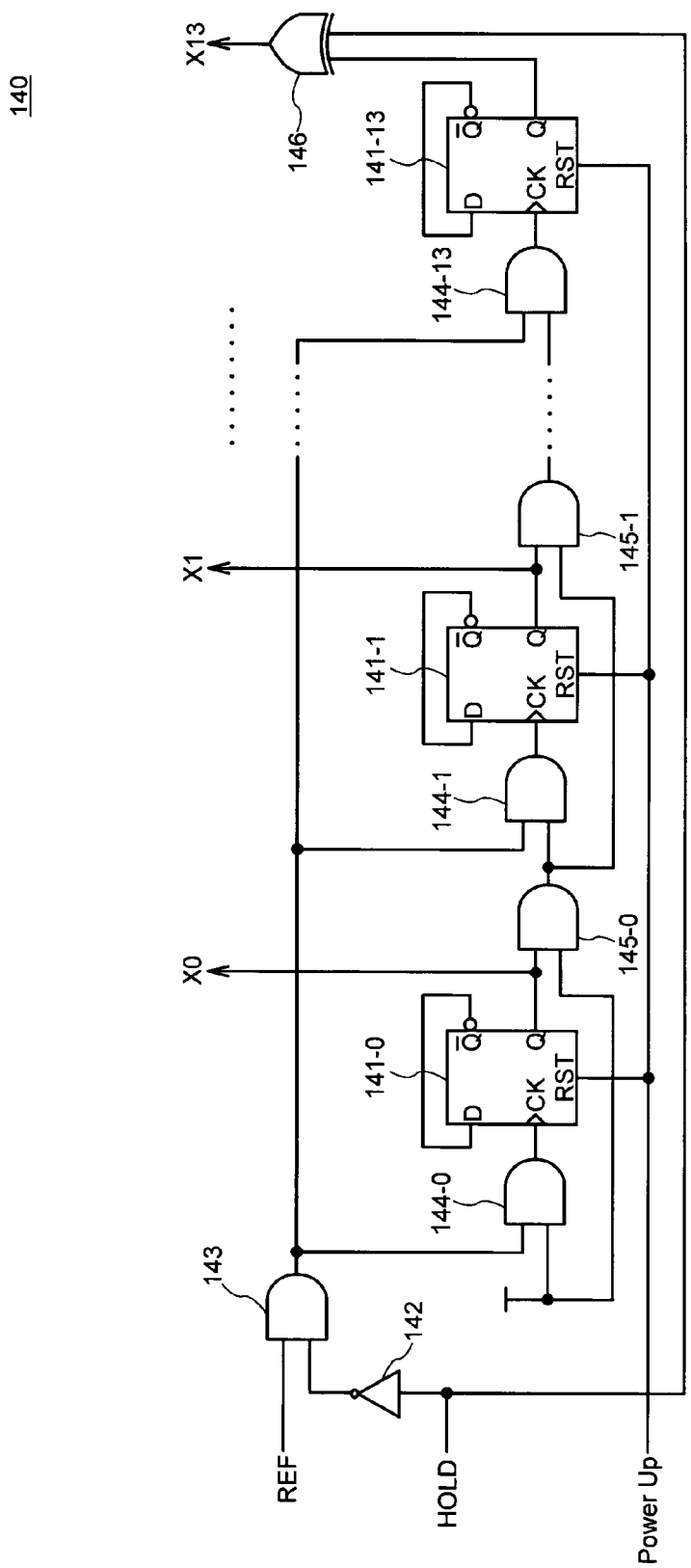
FIG. 3 is a circuit diagram of the refresh counter shown in FIG. 1.

FIG. 3 is a circuit diagram of the refresh counter 140.

As shown in FIG. 3, the refresh counter 140 includes flip-flop circuits 141-0 to 141-13 (hereinafter, collectively referred to as a "flip-flop circuit 141") corresponding to respective bits of an address. The refresh counter 140 further includes an AND circuit 143 that receives a refresh signal REF and a counter stop signal HOLD which is inverted by an inverter 142, AND circuits 144-0 to 144-13 (hereinafter, collectively referred to as an "AND circuit 144") that supply signals to clock nodes CK of the respective flip-flop circuits 141, AND circuits 145-0 to 145-12 (hereinafter, collectively referred to as an "AND circuit 145") that receive signals from the respective flip-flop circuits 141 and outputs from the pre-stage AND circuits 144, and an exclusive OR circuit 146 that receives the count stop signal HOLD and an output from the last-stage flip-flop circuit 141-13.

The flip-flop circuit 141 has an inverted output node /Q connected to an own data input node D. Because of this configuration, the content held in the flip-flop circuit 141 is inverted in response to a rise edge of a signal supplied to the clock node CK. A reset signal PowerUp is supplied to a reset node RST of the flip-flop circuit 141. Because of this, when the reset signal PowerUp is activated, all the content of the flip-flip circuits 141 are reset to "0".

An output signal of the AND circuit 143 and an output signal of the pre-stage AND circuit 145 are supplied to the AND circuit 144. With this arrangement, in the case where an increment operation is instructed when all the content of the lower flip-flop circuits 141 is "1", the outputs of the AND circuit 144 is set to a high level. Thus, the contents of the following flip-flop circuits 141 are inverted. In the case where the refresh signal REF becomes at a high level and the count stop signal HOLD becomes at a low level, the increment operation is instructed.

Based on the above arrangement, when the count stop signal HOLD is at a low level, each time when the refresh signal REF changes to a high level, the count value of the flip-flop circuit 141 is incremented. On the other hand, when the count stop signal HOLD is at a high level, the clock node CK of the flip-flop circuit 141 is fixed to a low level, and the increment of the count value is prohibited.

The exclusive OR circuit 146 is provided to change the logical value of the highest bit X13 of the count value. Specifically, when the count stop signal HOLD is at a low level, the exclusive OR circuit 146 outputs the content held in the flip-flop circuit 141-13 as X13. On the other hand, when the count stop signal HOLD is at a high level, the exclusive OR circuit 146 outputs the inverted value of the content held in the flip-flop circuit 141-13 as X13. The count value obtained in this way is supplied to the address selector 151 as the row address (X13 to X0).

The circuit configuration and the operation of the refresh counter 140 are as explained above.

Referring back to FIG. 1, the row address from the address selector 151 is also supplied to a ROM circuit group 160. The ROM circuit group 160 stores the address of a predetermined word line related to plural "refresh defective addresses", and is activated at the refresh operation time. The "refresh defective address" means the address which corresponds to a "refresh defective cell" of which information holding time does not meet the information holding time tREF as explained above.

In this embodiment, the ROM circuit group 160 stores not the refresh defective address that can be relieved but the address of a predetermined word line related to the refresh defective address. The "address of a predetermined word line related to the refresh defective address" means the address of which only a part of bits is different from that of the refresh defective address. In this embodiment, only the highest bit X13 is a different address. This address is hereinafter called a "relevant address".

A defective address that cannot be saved without replacing the cell with a redundant memory cell, such as an address of a short-circuit failure, is stored in other ROM circuit group (not shown) that is activated at the read operation time or the write operation time.

Figure 4:
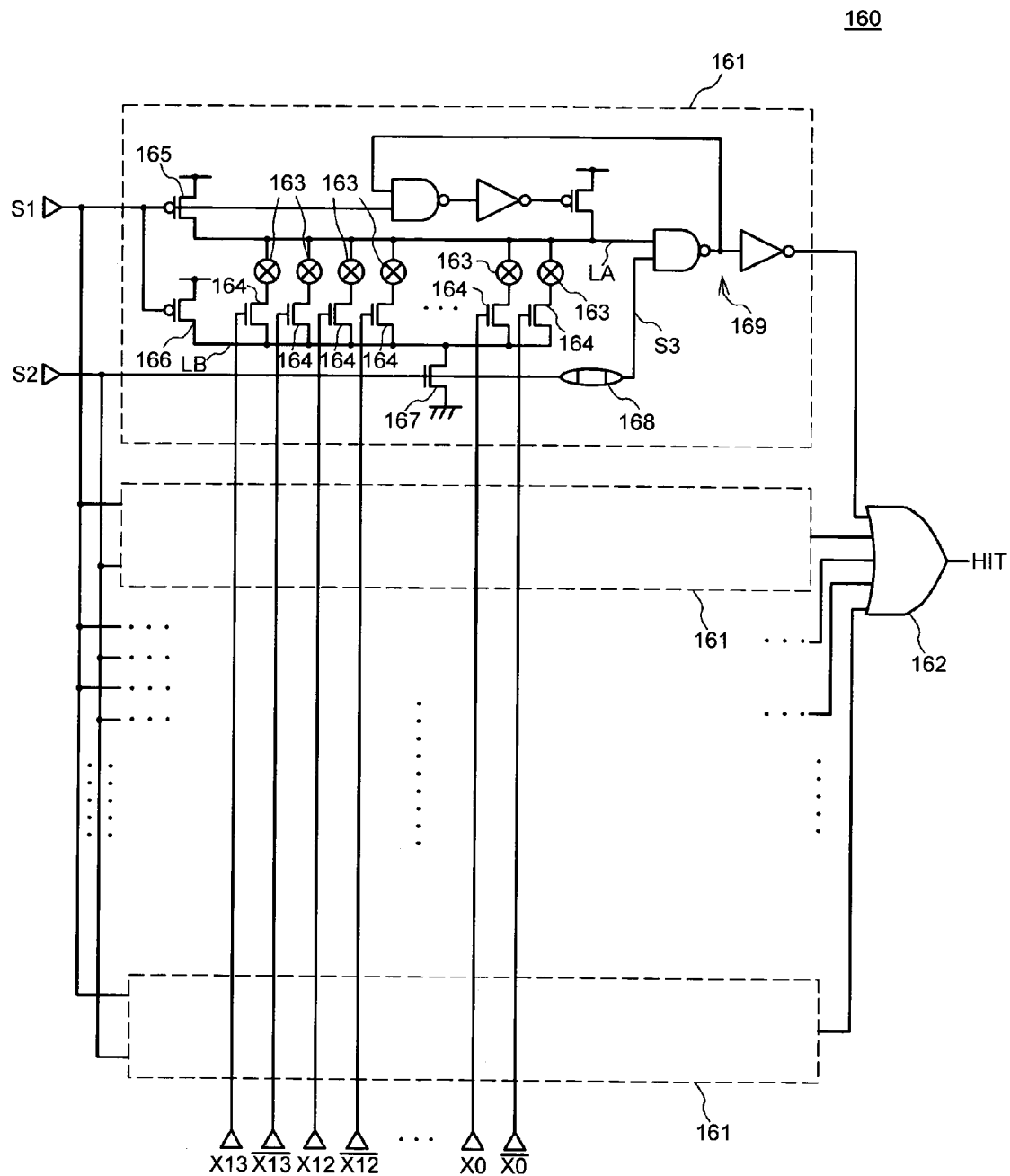
FIG. 4 is a circuit diagram showing one example of a detailed circuit configuration of the ROM circuit group shown in FIG. 1.

FIG. 4 is a circuit diagram showing one example of a detailed circuit configuration of the ROM circuit group 160.

As shown in FIG. 4, the ROM circuit group 160 includes plural ROM circuits 161, and an OR circuit 162 that receives outputs from these ROM circuits 161. Each ROM circuit 161 has ROM elements 163, corresponding to the row addresses (X13 to X0) and their inverted signals (/X13 to /X0), connected in parallel between a precharge line LA and a discharge line LB. An N-channel MOS transistor 164 is connected in series to each ROM element 163. The row addresses (X13 to X0) and their inverted signals (/X13 to /X0) are supplied to gate electrodes of these transistors 164, respectively. A fuse can be used for each ROM element 163.

In order to store a relevant address in the ROM circuit 161, one of two ROM elements 163 corresponding to the bits of the address is set to a nonconductive state (the fuse is disconnected). Specifically, when the bit X11 of the relevant address to be stored is "0", the ROM element 163 corresponding to X1 is set to a nonconductive state (disconnected), and the ROM element 163 corresponding to /X11 is set to a conductive state (not disconnected). On the other hand, in the ROM circuit 161 in which a relevant address is not stored, all ROM elements 163 are set to a conductive state (not disconnected).

The precharge line LA and the discharge line LB are connected to a power supply potential (VDD) via P-channel MOS transistors 165 and 166, respectively. Based on this, when a timing signal S1 becomes at a low level, the precharge line LA and the discharge line LB are precharged to the power supply potential. The discharge line LB is connected to a ground potential (GND) via an N-channel MOS transistor 167. Therefore, when a timing signal S2 becomes at a high level, the discharge line LB is discharged to the ground potential.

Figure 5:
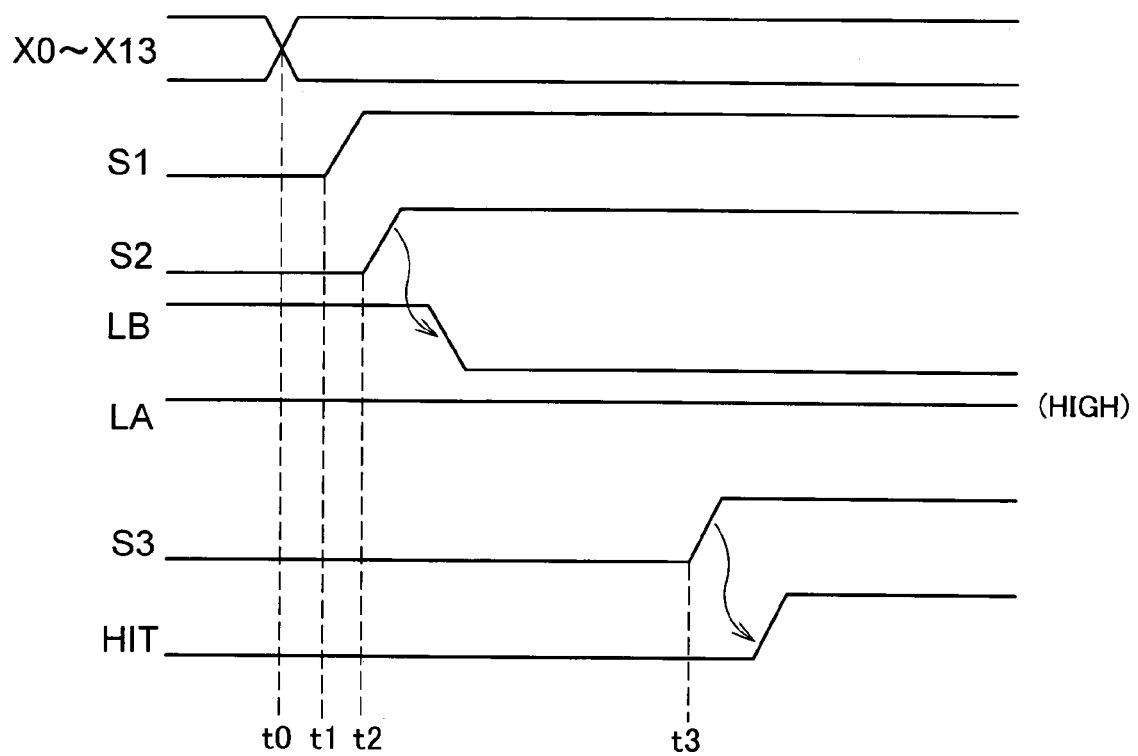
FIG. 5 is a timing chart showing the operation when the ROM circuit group detects a relevant address (when a HIT is detected)

FIG. 5 is a timing chart showing the operation when the ROM circuit group 160 detects a relevant address (when a HIT is detected).

First, in the initial state, the timing signals S1 and S2 at low levels. Therefore, the precharge line LA and the discharge line LB are precharged to a high level. A hit signal HIT is fixed to a low level.

When the row address supplied from the address selector 151 changes at time t0 and also when the timing signal S1 changes to a high level at time t1, the precharge operation is finished, and the precharge line LA and the discharge line LB become in a floating state.

When the timing signal S2 changes to a high level at time t2, the transistor 167 is turned on. Therefore, the potential of the discharge line LB changes to a low level. In this case, when the row address supplied from the refresh counter 140 coincides with the relevant address stored in the ROM circuit 161, that is, when all transistors 164 corresponding to the nonconductive ROM element 163 are turned on and when all transistors 164 corresponding to the conductive ROM element 163 are turned off, the potential of the precharge line LA does not change to a low level, and the precharge state is maintained, because there is no route that short-circuits between the precharge line LA and the discharge line LB.

When a timing signal S3 that is delayed from the timing signal S2 by a delay element 168 changes to a high level at time t3, all inputs of the AND circuit 169 become at a high level. Therefore, the output hit signal HIT changes to a high level, and the hit result is issued.

Figure 6:
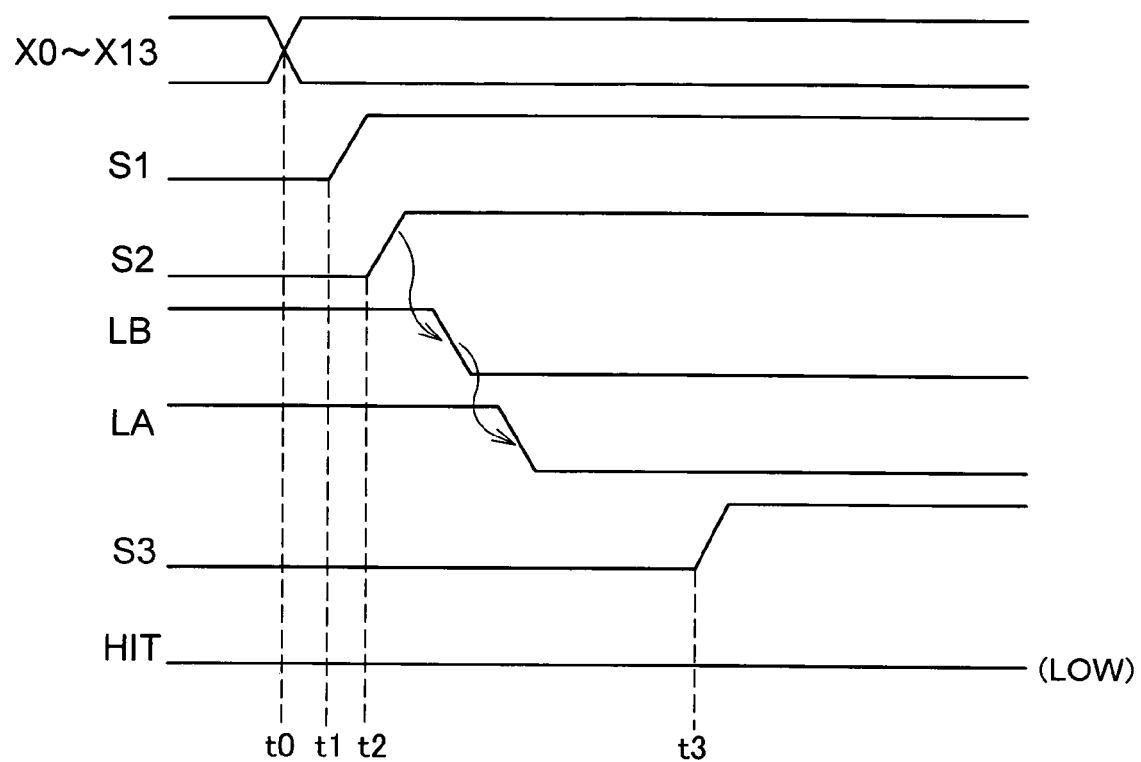
FIG. 6 is a timing chart showing the operation when the ROM circuit group does not detect a relevant address (when a HIT is not detected)

FIG. 6 is a timing chart showing the operation when the ROM circuit group 160 does not detect a relevant address (when a HIT is not detected).

The operation up to time t2 is the same as that shown in the timing chart shown in FIG. 5. At time t2, the timing signal S2 changes to a high level. In response to this change, the potential of the discharge line LB changes to a low level. The operation after this is different from that of the timing chart in FIG. 5. In other words, when a relevant address is not detected, at least one of the transistors 164 corresponding to the conductive ROM elements 163 is turned on. Therefore, the precharge line LA and the discharge line LB are short-circuited. Consequently, when the potential of the discharge line LB changes to a low level, the potential of the precharge line LA also changes to a low level.

Therefore, even when the timing signal S3 changes to a high level at time t3, the output hit signal HIT maintains at a low level, and the fact that no hit (MISSHIT) is notified.

The operation of the ROM circuit 161 shown in FIG. 4 is as explained above. Because the ROM circuit group 160 has plural ROM circuits 161, the ROM circuit group 160 can store plural relevant addresses. Therefore, in the refresh operation, each time when the counter value (row address) of the refresh counter 140 coincides with the relevant address, the hit signal HIT changes to a high level.

However, when the count stop signal HOLD is activated, the ROM circuit group 160 does not detect a HIT. In this case, the hit signal HIT is held at a low level. As a method of carrying out this control, when the count stop signal HOLD is activated, either the levels of the timing signals S1 and S2 are fixed or the hit signal HIT is fixed to a low level based on the control of the controller 150, by adding a gate circuit inside the ROM circuit group 160.

The hit signal HIT generated by the ROM circuit group 160 is supplied to a multiple refresh control circuit 170 as shown in FIG. 1. The multiple refresh control circuit 170 controls to simultaneously activate both the word line corresponding to the refresh defective address and a predetermined word line (word line corresponding to the relevant address) related to this word line, within one refresh cycle.

In the present invention, the operation of simultaneously (or continuously) activating word lines within one refresh cycle is called a "multiple refresh". The multiple refresh control circuit 170 generates both the multiple refresh signal MULTI and the count stop signal HOLD, based on the hit signal HIT. The multiple refresh signal MULTI is supplied to the multiple selecting circuit 110, and the count stop signal HOLD is supplied to the refresh counter 140.

The multiple refresh signal MULTI is activated when the hit signal HIT is received while the multiple refresh control circuit 170 is in the "normal state". As described above, when the multiple refresh signal MULTI is activated (becomes at a high level), the multiple selecting circuit 110 activates both the predecode signal 110a and the predecode signal 110b.

On the other hand, the count stop signal HOLD is activated simultaneously with the next refresh signal REF when the hit signal HIT is received while the multiple refresh control circuit 170 is in the "prohibited state". As described above, when the count stop signal HOLD is activated (becomes at a high level), the refresh counter 140 stops the count operation, and inverts the logical value of the highest bit X13 of the count value, and outputs the inverted value.

A transition from the normal state to the prohibited state occurs when the appearance pattern of the multiple refresh coincides with a predetermined "multiple refresh prohibited pattern". The "multiple refresh prohibited pattern" means the appearance pattern having a risk of the occurrence of a large variation in the power supply potential or the ground potential as a result of a continuous occurrence of the multiple refresh or a continuation of the multiple refresh at a high frequency.

While there is not a particularly limited pattern, continuous occurrence of the multiple refresh at a predetermined number of times (for example, continuous occurrence of the multiple refresh at two times) or the appearance of the multiple refresh at a predetermined number of times within a predetermined period (for example, appearance of the multiple refresh at three times during 500 ns) are example patterns. A type of the "multiple refresh prohibited pattern" can be suitably determined based on the capacity of the power supply circuit.

On the other hand, a transition from the prohibited state to the normal state occurs when a "multiple refresh permitted pattern" indicating that the multiple refresh is not carried out during a predetermined period or at a predetermined number of times occurs or when the read operation or the write operation is carried out. In other words, the "multiple refresh permitted pattern" means a state that, as a result of a continuation of the state that the multiple refresh is not carried out during a predetermined period or is not carried out at a predetermined number of cycles, there is little risk of the occurrence of a large variation in the power supply potential or the ground potential even when the multiple refresh is carried out again.

While there is not a particularly limited pattern, appearance of the normal refresh which is not the multiple refresh or non-appearance of the multiple refresh during 500 ns are example patterns. A type of the "multiple refresh permitted pattern" can be suitably determined based on the capacity of the power supply circuit.

Figure 7:
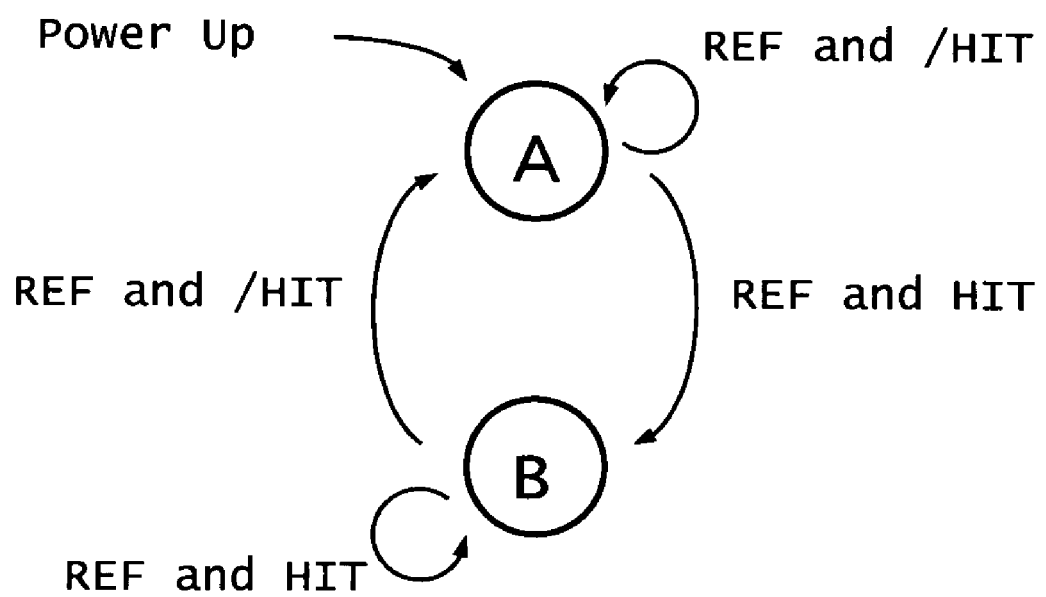
FIG. 7 is a status diagram showing one example of a transition condition.

FIG. 7 is a status diagram showing one example of a transition condition. In FIG. 7, "A" represents a normal state, and "B" represents a prohibited state.

In the example shown in FIG. 7, the one-time occurrence of the multiple refresh is regarded as the "multiple refresh prohibited pattern", and the occurrence of the normal refresh, not the multiple refresh, is regarded as the "multiple refresh permitted pattern".

Specifically, in the initial state when the reset signal PowerUp is activated, this state is the "normal state (A)". Thereafter, even when the refresh signal REF is activated, when the hit signal HIT is inactive (=/HIT), the normal state (A) is continued to be maintained. On the other hand, when both the refresh signal REF and the hit signal HIT are activated, that is, when the multiple refresh occurs, this state is transited to the "prohibited state (B)", and the multiple refresh at the next time is prohibited.

When the refresh signal REF is activated and also when the hit signal HIT is inactivated, that is, when the normal refresh, not the multiple refresh, occurs, this state is return back to the "normal state (A)", and the multiple refresh is permitted next time.

Figure 8:
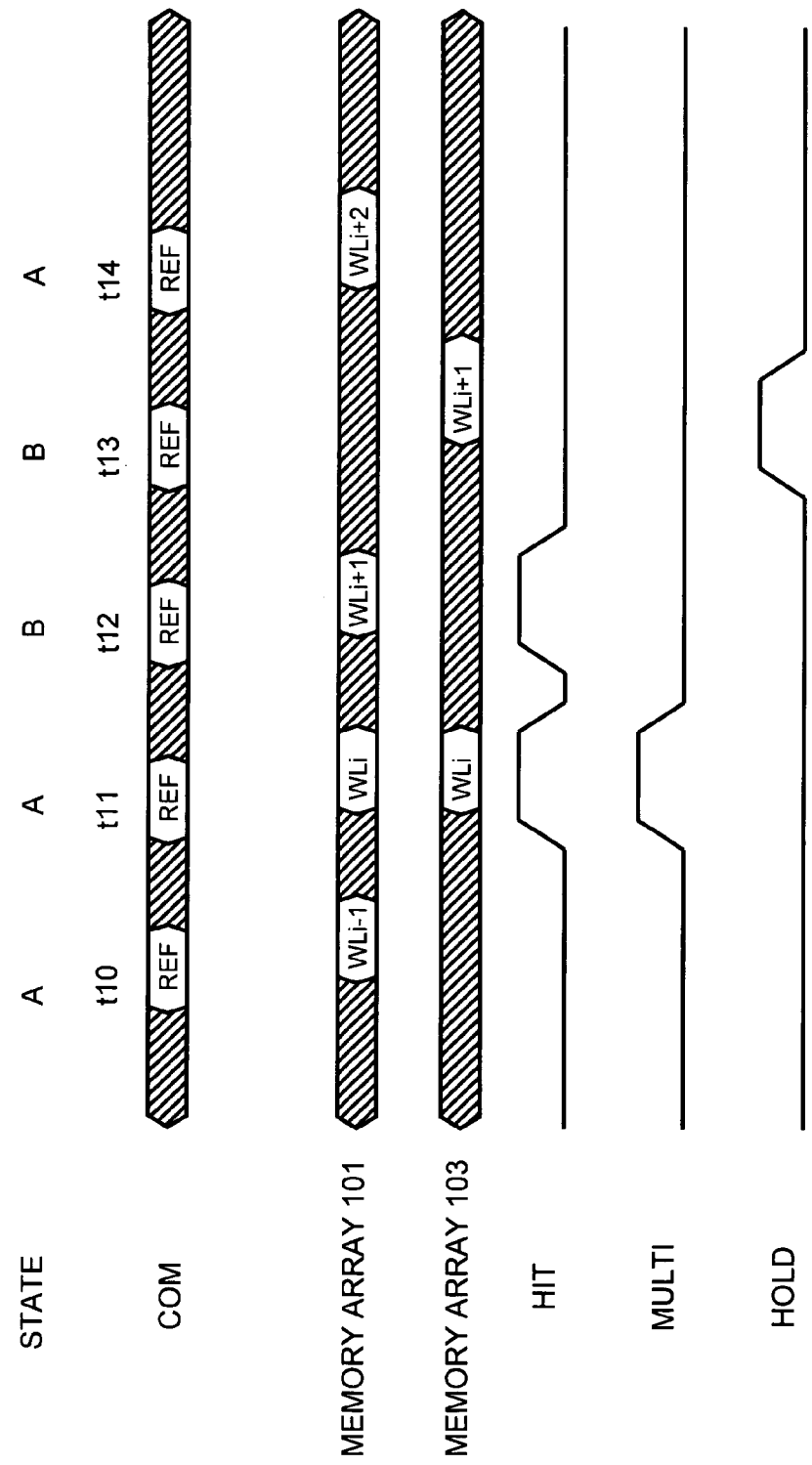
FIG. 8 is a timing chart for explaining the operation of the semiconductor device in the transition condition shown in FIG. 7.

FIG. 8 is a timing chart for explaining the operation of the semiconductor device 100 in the transition condition shown in FIG. 7. FIG. 8 shows an example of a state that a word line WLi and a word line WLi+1 that are included in the memory array 103 are refresh defective addresses. Therefore, both the word line WLi and the word line WLi+1 that are included in the memory array 101 are the word lines corresponding to relevant addresses.

In the example shown in FIG. 8, the highest bit X13 of the row address that is output from the refresh counter 104 is "0". Therefore, the memory array 101 or 102 (memory array 101, in this case) is selected. Consequently, a word line WLi—1 of the memory array 101 is first activated in response to a refresh command (denoted as "REF" which expresses a refresh signal in FIG. 8, and this similarly applies to the subsequent explanation) that is input at time t10.

As shown in FIG. 8, when a HIT is detected corresponding to the refresh command that is input at time t11, the hit signal HIT that is output from the ROM circuit group 160 changes to a high level. In this case, the multiple refresh control circuit 170 is in the normal state (A), that is, in the multiple refresh permitted state. Therefore, the multiple refresh signal MULTI is also activated at a high level. On the other hand, the count stop signal HOLD is maintained at a low level.

In this case, the highest bit (X13) of the row address is "0". Therefore, although only the predecode signal 110a should originally become at a high level, both the predecode signal 110a and predecode signal 110b become at a high level because the multiple refresh signal MULTI changes to a high level. Accordingly, the word line WLi that is included in the memory array 101 and the word line WLi that is included in the memory array 103 are activated simultaneously. In other words, the multiple refresh is carried out. Accordingly, the multiple refresh control circuit 170 is transited from the normal state (A) to the prohibited state (B), and the multiple refresh at the next time is prohibited.

Therefore, even when the HIT is detected again in response to the refresh command that is input at time t12, the multiple refresh signal MULTI does not become a high level and is kept at a low level because the multiple refresh control signal 170 is in the prohibited state. Consequently, the multiple refresh is not executed, and the normal refresh is executed to only the word line WLi+1 of the memory array 101.

When the next refresh command is input at time t13, the count stop signal HOLD becomes a high level. Accordingly, the logical value of the highest bit X13 of the count value is inverted (="1"). Therefore, the predecode signal activated by the multiple selecting circuit 110 is switched to the predecode signal 110b instead of the predecode signal 110a, and the increment operation of the refresh counter 140 is interrupted temporarily. Accordingly, the word line WLi+1 included in the memory array 103 is activated in this refresh cycle in which the word line WLi+2 included in the memory array 101 should be originally activated. In other words, the word line WLi+1 of the refresh defective address can be refreshed more frequently than other word line, without carrying out the multiple refresh.

When this operation is completed, the multiple refresh control circuit 170 is transited from the prohibited state (B) to the normal state (A), and thereafter, continues the normal refresh operation in response to the refresh command REF.

As explained above, in this example, when multiple refresh occurs at least once, the state is immediately transited to the prohibited state. Therefore, continuous appearance of the multiple refresh can be prevented.

Figure 9:
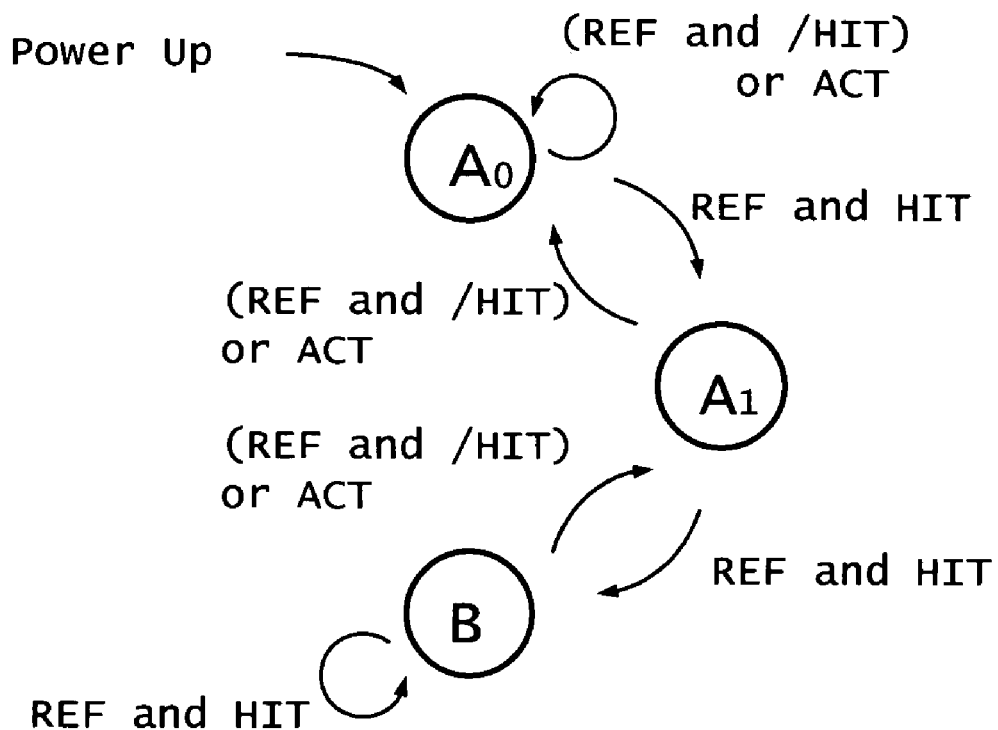
FIG. 9 is a status diagram showing another example of a transition condition.

FIG. 9 shows a state of another example of a transition condition. In FIG. 9, "$A_0$" and "$A_1$" represent first and second normal states, respectively, and "B" represents a prohibited state.

In the example shown in FIG. 9, the two-time continuous occurrence of the multiple refresh is regarded as the "multiple refresh prohibited pattern", and the occurrence of the normal refresh, not the multiple refresh, is regarded as the "multiple refresh permitted pattern".

In other words, in the initial state when the reset signal PowerUp is activated, this state is a "first normal state ($A_0$)". Thereafter, even when the refresh signal REF is activated, when the hit signal HIT is inactive (=/HIT), the first normal state ($A_0$) is continued to be maintained. This is similarly applied when the activation signal ACT is activated during this period, and when the read operation or the write operation is carried out.

On the other hand, when both the refresh signal REF and the hit signal HIT are activated, that is, when the multiple refresh occurs, this state is transited to a "second normal state ($A_1$)". The operation in the second normal state ($A_1$) is the same as the operation in the first normal state ($A_0$). The second normal state ($A_1$) is a state immediately before the prohibited state (B), unlike the first normal state ($A_0$). Therefore, when both the refresh signal REF and the hit signal HIT are activated in the second normal state ($A_1$), that is, when the multiple refresh occurs again, this state is transited to the "prohibited state (B)".

On the other hand, when the normal refresh, not the multiple refresh, occurs, the state returns to the "first normal state ($A_0$)". This is similarly applied when the activation signal ACT is activated in the second normal state ($A_1$) and when the read operation or the write operation is carried out.

When the state is transited to the "prohibited state (B)", the multiple refresh at the next time is prohibited. When the refresh signal REF is activated and also when the hit signal HIT is inactivated, that is, when the normal refresh, not the multiple refresh, occurs, this state is transited to the "second normal state ($A_1$)", and the multiple refresh is permitted next time. This is similarly applied when the activation signal ACT is activated and then the read operation or the write operation is carried out in the prohibited state (B).

Figure 10:
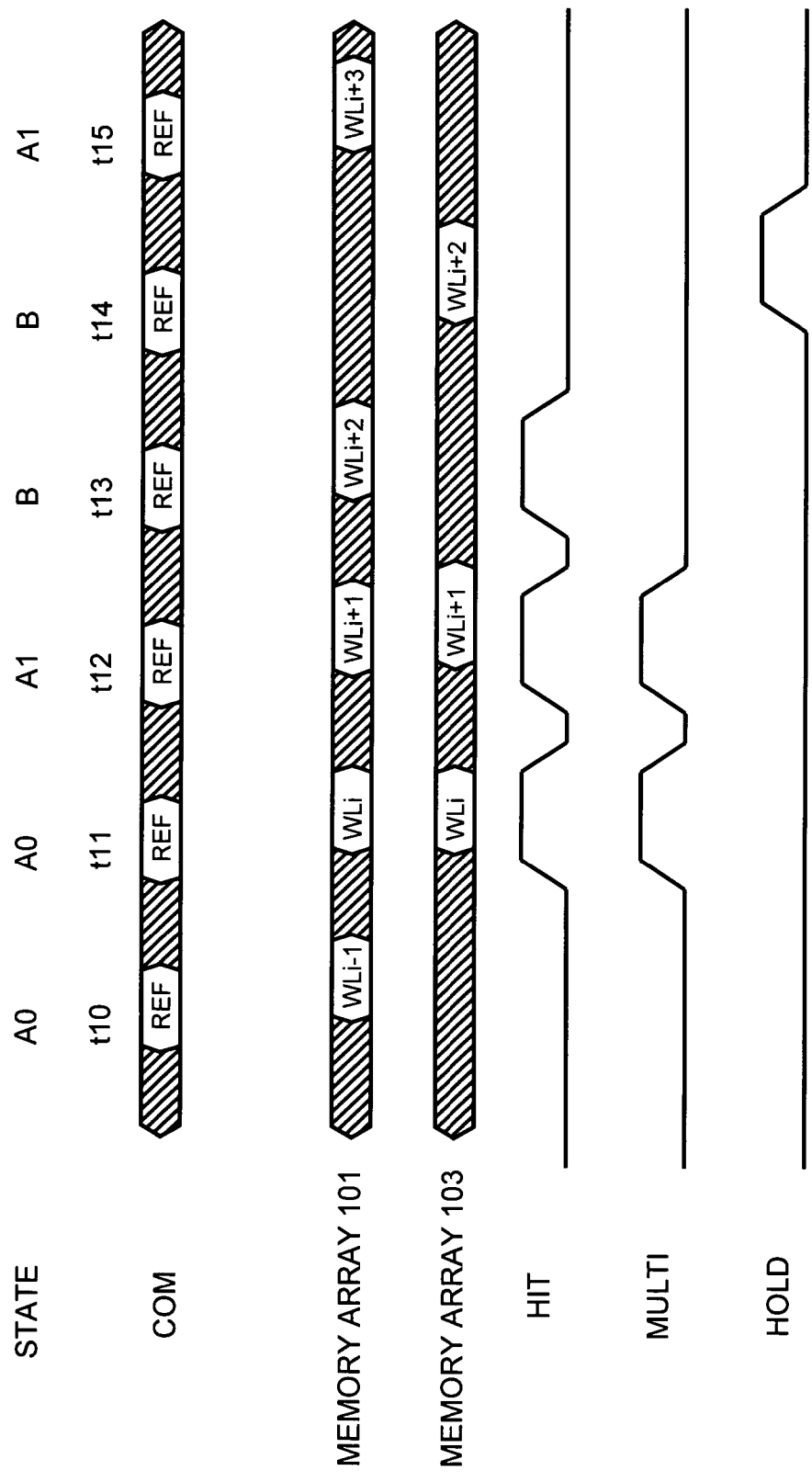
FIG. 10 is a timing chart for explaining the operation of the semiconductor device in the transition condition shown in FIG. 9.

FIG. 10 is a timing chart for explaining the operation of the semiconductor device 100 in the transition condition shown in FIG. 9. FIG. 10 shows an example of a state that the word line WLi, the word line WLi+1, and the word line WLi+2 that are included in the memory array 103 are refresh defective addresses. Therefore, the word line WLi, the word line WLi+1, and the word line WLi+2 that are included in the memory array 101 are all word lines corresponding to relevant addresses.

In the example shown in FIG. 10, the highest bit X13 of the row address that is output from the refresh counter 104 is "0". Consequently, the word line WLi−1 of the memory array 101 is activated in response to the refresh command that is input at time t10.

When a HIT is detected corresponding to the refresh command that is input at time t11, the hit signal HIT and the multiple refresh signal MULTI that are output from the ROM circuit group 160 are activated at a high level. Therefore, the word line WLi included in the memory array 101 and the word line WLi included in the memory array 103 are activated simultaneously. In other words, the multiple refresh is carried out. Accordingly, the multiple refresh control circuit 170 is transited from the first normal state ($A_0$) to the second normal state ($A_1$).

When a HIT is detected again corresponding to the refresh command that is input at time t12, both the hit signal HIT and the multiple refresh signal MULTI are activated at a high level. As a result the word line WLi+1 that is included in the memory array 101 and the word line WLi+1 that is included in the memory array 103 are activated simultaneously. In other words, the multiple refresh is carried out again. As a result, the multiple refresh control circuit 170 is transited from the second normal state ($A_1$) to the prohibited state (B), and the multiple refresh at the next time is prohibited.

Therefore, even when the HIT is detected in response to the refresh command that is input at time t13, the multiple refresh signal MULTI does not become a high level and is kept at a low level because the multiple refresh control signal 170 is in the prohibited state. Consequently, the multiple refresh is not executed, and the normal refresh is executed to only the word line WLi+2 of the memory array 101.

When the next refresh command is input at time t14, the count stop signal HOLD becomes a high level. Accordingly, the word line WLi+2 included in the memory array 103 is activated in this refresh cycle in which the word line WLi+3 included in the memory array 101 should be originally activated. In other words, the word line WLi+2 of the refresh defective address can be refreshed more frequently than other word line, without carrying out the multiple refresh.

When this operation is completed, the multiple refresh control circuit 170 is transited from the prohibited state (B) to the second normal state ($A_1$).

As explained above, in this example, when multiple refresh occurs continuously two times, the state is transited to the prohibited state. Therefore, continuous appearance of the multiple refresh at three or more times can be prevented.

Figure 11:
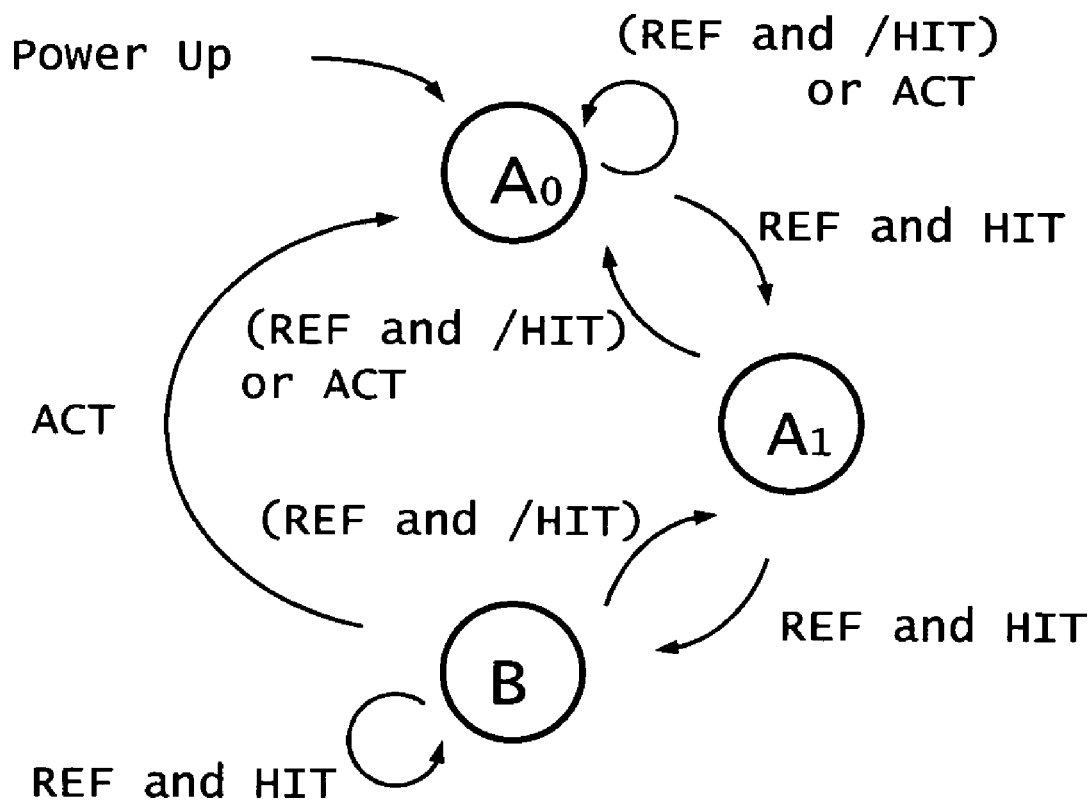
FIG. 11 is a status diagram showing still another example of a transition condition.

FIG. 11 shows a state of still another example of a transition condition. In FIG. 11, "$A_0$" and "$A_1$" represent first and second normal states, respectively, and "B" represents a prohibited state.

The example shown in FIG. 11 is basically the same as the transition condition shown in FIG. 9, except the following. In the "prohibited state (B)", when the normal refresh, not the multiple refresh, occurs, the state is transited to the "second normal state ($A_1$)", and when the read operation or the write operation is carried out, the state is transited to the "first normal state ($A_0$)". This transition condition takes into consideration that, in the read operation or the write operation, a large current does not flow in a short time like that in the refresh operation.

Figure 12:
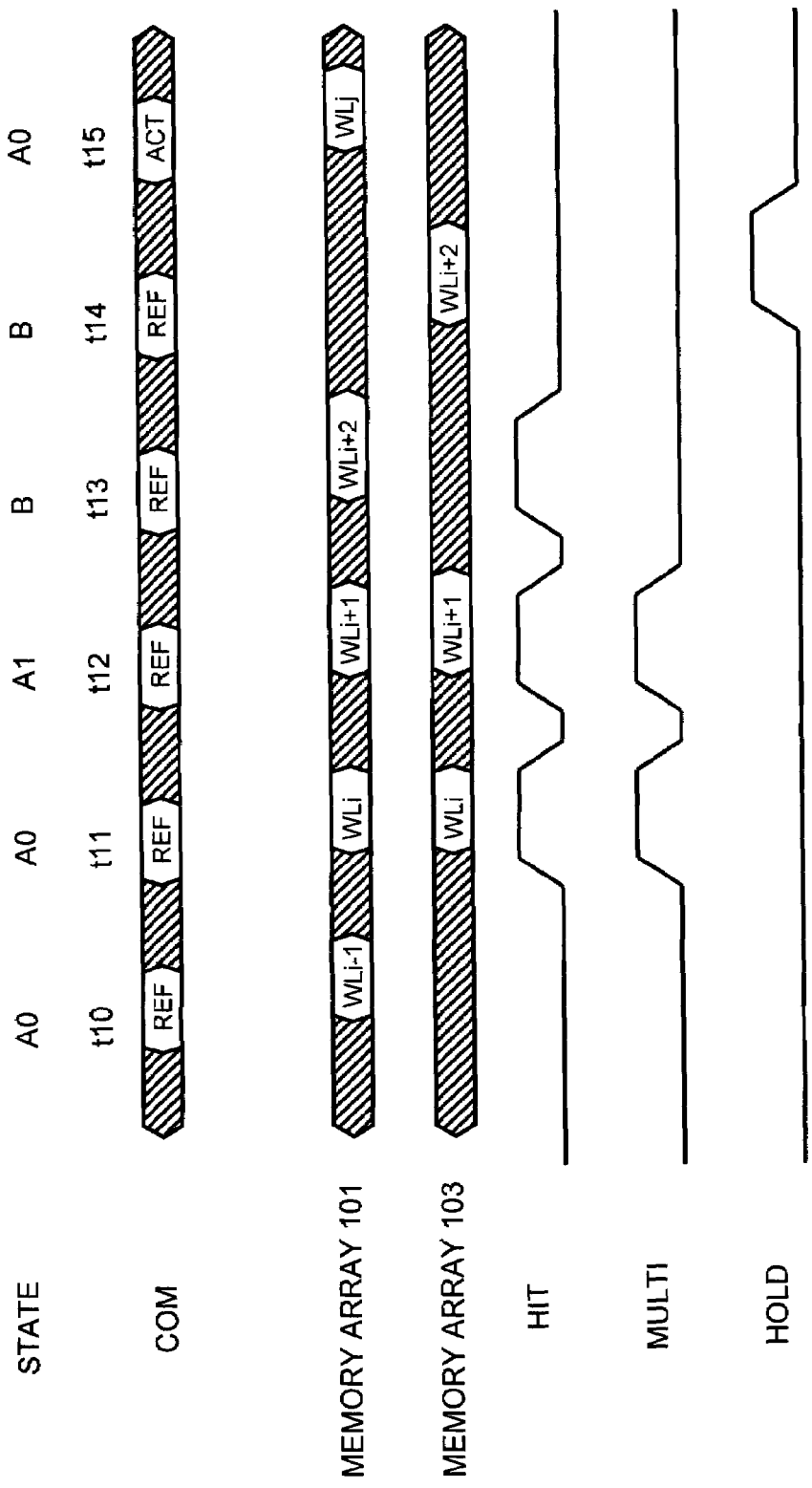
FIG. 12 is a timing chart for explaining the operation of the semiconductor device in the transition condition shown in FIG. 11.

FIG. 12 is a timing chart for explaining the operation of the semiconductor device 100 in the transition condition shown in FIG. 11. As shown in FIG. 12, the operation up to time t14 is the same as that shown in FIG. 11. However, it is clear that when the activation signal ACT is activated and when the optional word line WLj is activated by the read operation or the write operation at time t15, the multiple refresh control circuit 170 is transited from the prohibited state (B) to the first normal state ($A_0$).

As explained above, in this example, continuous appearance of the multiple refresh at three or more times can be also prevented. When the read operation or the write operation is carried out, the state is transited to the "first normal state ($A_0$)" without exception. Therefore, as compared with the transition condition shown in FIG. 9, the probability that the state is transited to the prohibited state (B) can be decreased.

Transition conditions are not limited to those shown in FIGS. 7, 9, and 11, and can be set to other transition conditions.

As explained above, according to the semiconductor device 100 of this embodiment, at the time of refreshing a predetermined word line related to a refresh defective address, the multiple refresh is carried out, in the normal state. On the other hand, when the multiple refresh prohibited pattern appears, the state is transited to the prohibited state, and two addresses to be multiple refreshed are refreshed individually in separate refresh cycles. Therefore, the variation in the power supply potential and the ground potential due to continuous occurrence of the multiple refresh can be effectively restricted.

The effect of the present invention is remarkable when the count of the refresh counter 140 is incremented (or decremented) each time when a refresh command is input from the outside, like the auto refresh. In other words, in the auto refresh, the refresh command has a possibility of being input continuously in a minimum cycle (such as 100 ns). In this case, variation in the power supply potential or the ground potential due to the multiple refresh can occur considerably. Therefore, in carrying out the auto refresh, it is very significant to limit the appearance pattern of the multiple refresh like in the present invention.

While plural word lines are simultaneously activated within one refresh cycle to carry out the multiple refresh in this embodiment, the plural word lines do not need to be activated simultaneously so long as the plural word lines are activated within one refresh cycle. The plural word lines can be activated continuously within one refresh cycle.

Figure 13:
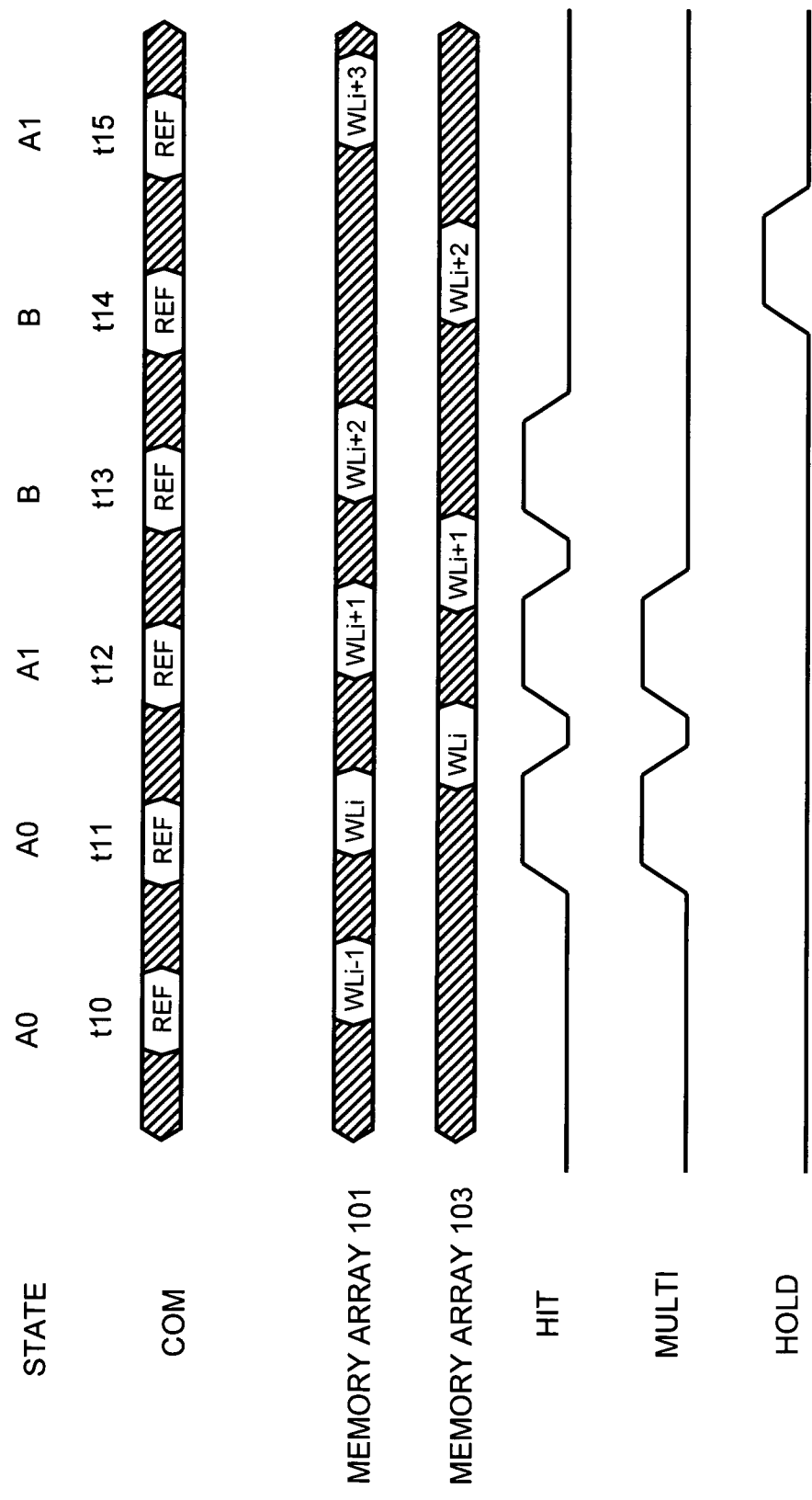
FIG. 13 is a timing chart showing an example of carrying out the multiple refresh by continuously activating two word lines within one refresh cycle, and the operation corresponds to that shown in FIG. 10.

FIG. 13 is a timing chart showing an example of carrying out the multiple refresh by continuously activating two word lines within one refresh cycle, and the operation corresponds to that shown in FIG. 10.

FIG. 13 shows a state that the word line WLi included in the memory array 101 and the word line WLi included in the memory array 103 are activated continuously within one refresh cycle in response to a refresh command input at time t11, and the word line WLi+1 included in the memory array 101 and the word line WLi+1 included in the memory array 103 are activated continuously within one refresh cycle in response to a refresh command input at time t12. As explained above, according to the present invention, the multiple refresh can be carried out by continuously activating plural word lines within one refresh cycle.

In the above embodiment, all the row addresses (X13 to X0) that are supplied to the row decoders 121 to 124 are supplied to the ROM circuit group 160. Each ROM circuit 161 activates the hit signal HIT in response to the fact that the row addresses (X13 to X0) completely coincide with the addresses of predetermined word lines related to the refresh defective address. Alternatively, a degenerate bit can be provided in each ROM circuit 161, and the hit signal HIT is activated in response to the fact that a part of the row addresses (X13 to X0) coincides with the address of a predetermined word line related to the refresh defective address. When the degenerate bit is provided, the number of times when the hit signal HIT is activated increases, but the number of the ROM elements 163 can be decreased.

Preferably, the degenerate bit is set to a bit other than the lowest bit (X0) of the output of the refresh counter 140. Particularly, it is preferable to set the degenerate bit to a higher bit. Because the row address supplied from the refresh counter 140 is incremented (or decremented), when the degenerate bit is set to the lowest bit X0 of the count value, the hit signal HIT continuously occurs at two times without exception. Accordingly, the multiple refresh prohibited pattern occurs easily. On the other hand, when the degenerate bit is set to a high bit, the occurrence of the multiple refresh that increases due to the setting of the degenerate bit can be more dispersed. Consequently, the appearance of the multiple refresh prohibited pattern can be restricted.

Assume that the degenerate bit is the highest bit X13, when the word line WLi included in the memory array 101 is a refresh defective address, the multiple refresh is carried out when both the word line WLi included in the memory array 101 and the word line WLi included in the memory array 103 are selected. In other words, the multiple refresh is carried out when both the word line corresponding to the defective memory cell and the word line related to this word line are selected.

The present invention is in no way limited to the aforementioned embodiments, but rather various modifications are possible within the scope of the invention as recited in the claims, and naturally these modifications are included within the scope of the invention.

For example, while the multiple refresh is carried out by simultaneously activating two word lines in the above embodiment, the number of word lines that are simultaneously activated is not limited to two, and can be three or more.

As explained above, according to the present invention, because the appearance pattern of the multiple refresh is limited, a pattern having a risk of a large variation in the power supply potential or the ground potential such as a pattern of continuous occurrence of the multiple refresh can be excluded. Accordingly, the refresh defective cell can be relieved while restricting a variation in the power supply potential or the ground potential.

What is claimed is:

1. A semiconductor memory device, comprising:
a plurality of word lines including a first word line and a second word line;
a plurality of memory cells connected to the word lines;
a first unit that outputs an address of a word line to be activated;
a second unit that carries out multiple refresh of simultaneously or continuously activating the first word line corresponding to the defective memory cell and the second word line related to the first word line, within one refresh cycle, in response to a fact that at least the first unit outputs an address of the second word line; and
a third unit that limits an appearance pattern of the multiple refresh.

2. The semiconductor memory device as claimed in claim 1, wherein said first unit includes a refresh counter that performs increment operation or decrement operation in response to a refresh command supplied from the outside.

3. The semiconductor memory device as claimed in claim 1, wherein said second unit also carries out the multiple refresh in response to a fact that the first unit outputs an address of the first word line.

4. The semiconductor memory device as claimed in claim 2, wherein said second unit also carries out the multiple refresh in response to a fact that the first unit outputs an address of the first word line.

5. The semiconductor memory device as claimed in claim 1, wherein said second unit includes a ROM circuit that stores at least a part of bits of the address of the first word line.

6. The semiconductor memory device as claimed in claim 5, wherein said ROM circuit stores only a part of bits including at least a lowest bit of the address output by the first unit.

7. The semiconductor memory device as claimed in claim 1, wherein said third unit prohibits the multiple refresh in a next refresh cycle, when the appearance pattern of the multiple refresh coincides with a predetermined multiple refresh prohibited pattern.

8. The semiconductor memory device as claimed in claim 7, wherein said third unit permits the multiple refresh in the next refresh cycle, when the multiple refresh is not carried out during a predetermined period or at a predetermined number of cycles.

9. The semiconductor memory device as claimed in claim 7, wherein said third unit permits the multiple refresh in the next refresh cycle, when a read operation or a write operation is carried out.

10. The semiconductor memory device as claimed in claim 8, wherein said third unit permits the multiple refresh in the next refresh cycle, when a read operation or a write operation is carried out.

11. A semiconductor memory device, comprising:
a plurality of word lines;
a plurality of memory cells connected to the word lines; and
a refresh circuit that refreshes the plurality of memory cells by sequentially activating the plurality of word lines,
in a normal state, said refresh circuit refreshing a first address and a second address corresponding to the first address in the same refresh cycle, in response to a fact that a refresh operation of the first address is instructed,
in a prohibited state, said refresh circuit refreshing the first address and the second address in separate refresh cycles, in response to a fact that the refresh operation of the first address is instructed.

12. The semiconductor memory device as claimed in claim 11, wherein when an appearance pattern of a multiple refresh for refreshing the first and the second addresses in the same refresh cycle coincides with a multiple refresh prohibited pattern, a state of the semiconductor memory device is transited from the normal state to the prohibited state.

13. The semiconductor memory device as claimed in claim 12, wherein when the multiple refresh is not carried out during a predetermined period or at a predetermined number of cycles, a state of the semiconductor memory device is transited from the prohibited state to the normal state.

14. The semiconductor memory device as claimed in claim 12, wherein when a read operation or a write operation is carried out, a state of the semiconductor memory device is transited from the prohibited state to the normal state.

15. The semiconductor memory device as claimed in claim 13, wherein when a read operation or a write operation is carried out, a state of the semiconductor memory device is transited from the prohibited state to the normal state.

16. A semiconductor memory device, comprising:
a refresh counter of which count is incremented or decremented in response to a refresh signal;
a ROM circuit group that detects a coincidence of a count value of the refresh counter and a plurality of stored addresses; and
a means for prohibiting the refresh counter to be incremented or decremented, in response to a fact that a coincidence pattern detected by the ROM circuit group corresponds to a predetermined pattern.

17. The semiconductor memory device as claimed in claim 16, wherein said prohibiting means inverts a part of bits of the count value of the refresh counter, in response to a fact that the coincidence pattern detected by the ROM circuit group corresponds to said predetermined pattern.

* * * * *